(12) United States Patent
Miyazaki et al.

(10) Patent No.: US 8,908,381 B2
(45) Date of Patent: Dec. 9, 2014

(54) HOUSING FOR ELECTRONIC DEVICE UNIT

(75) Inventors: Takayuki Miyazaki, Chiyoda-ku (JP);
Hirokazu Nomoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 200 days.

(21) Appl. No.: 13/810,069

(22) PCT Filed: Jul. 30, 2010

(86) PCT No.: PCT/JP2010/062947
§ 371 (c)(1),
(2), (4) Date: Jan. 14, 2013

(87) PCT Pub. No.: WO2012/014325
PCT Pub. Date: Feb. 2, 2012

(65) Prior Publication Data
US 2013/0113349 A1 May 9, 2013

(51) Int. Cl.
*H05K 5/00* (2006.01)
*H05K 5/02* (2006.01)
*H05K 9/00* (2006.01)

(52) U.S. Cl.
CPC ............ *H05K 5/0247* (2013.01); *H05K 9/0079* (2013.01)
USPC ........... 361/752; 361/535; 361/536; 361/796; 361/797; 361/800; 312/223.2; 174/50; 174/377; 174/520; 220/4.02

(58) Field of Classification Search
USPC ......... 361/535, 536, 752, 796, 797, 800, 812, 361/816; 312/223.2; 174/50, 520, 377; 220/4.02
See application file for complete search history.

(56) References Cited

U.S. PATENT DOCUMENTS 5,995,377 A * 11/1999 Tusler et al. .................. 361/796
6,335,868 B1 * 1/2002 Butterbaugh et al. ........ 361/796
(Continued)

FOREIGN PATENT DOCUMENTS

JP  56-038498 U1  4/1981
JP  61-51780 U   4/1986
(Continued)

OTHER PUBLICATIONS

Japanese Office Action (Notice of Rejection), mailed Nov. 12, 2013.
(Continued)

*Primary Examiner* — Robert J Hoffberg
*Assistant Examiner* — Hung Dang
(74) *Attorney, Agent, or Firm* — Sughrue Mion, PLLC (57) ABSTRACT

A housing for an electronic device unit includes a first case and a second case that are formed in a shape of a box with one of respective surfaces thereof being opened and are formed to be a box body. The housing includes an insulating plate that extends from the opening part of the first case to a side of the second case and overlaps with a wall surface of the second case. An engaging convex part is formed on a surface where the insulating plate is overlapped and an engaging hole that engages with the engaging convex part to regulate separation of the first case and the second case is formed. The insulating plate is in a shape in which an edge of the insulating plate spreads with a predetermined width from an opening edge where the first case and the second case are butted and the engaging hole.

6 Claims, 7 Drawing Sheets

(56) References Cited

U.S. PATENT DOCUMENTS

| | | | |
|---|---|---|---|
| 7,301,762 B2 * | 11/2007 | Han | 361/679.33 |
| 8,023,258 B2 * | 9/2011 | Chen et al. | 361/679.33 |
| 2003/0099100 A1 * | 5/2003 | Baker | 361/796 |

FOREIGN PATENT DOCUMENTS

| JP | 62-8678 U | 1/1987 |
|---|---|---|
| JP | 07-007227 U | 1/1995 |
| JP | 3035331 U | 12/1996 |
| JP | 2000-347605 A | 12/2000 |
| JP | 2001-072116 A | 3/2001 |
| JP | 2010-147094 A | 7/2010 |

OTHER PUBLICATIONS

Korean Office Action (Notice of Preliminary Rejection), mailed Jan. 22, 2014.

Japanese Office Action, dated Apr. 23, 2013, Patent Application No. 2012-526267.

* cited by examiner

HOUSING FOR ELECTRONIC DEVICE UNIT

CROSS REFERENCE TO RELATED APPLICATIONS

This application is a National Stage of International Application No. PCT/JP2010/062947 filed Jul. 30, 2010, the contents of all of which are incorporated herein by reference in their entirety.

FIELD

The present invention relates to a housing for an electronic device unit that accommodates a substrate therein, and more particularly to an improvement in insulation properties against static electricity by a fitting structure of divided two cases.

BACKGROUND

Conventionally, in relation to a shielding device applied to an electric component that widely requires insulation and shielding, it is known to provide a sufficient distance between a terminal unit and metal in order to prevent an electric discharge. That is, it is known that a creepage distance is necessary to increase a dielectric strength (see, for example, Patent Literature 1).

Also conventionally, in a portable receiver that accommodates a circuit assembly connected to a built-in antenna in a housing, for the purpose of improving electrostatic withstand voltage properties, it is proposed that an insulating cover that covers a part of the built-in antenna is arranged in the housing, and a creepage distance from a space in the housing to the built-in antenna is set to be longer in order to increase an electrostatic withstand voltage for improving electrostatic withstand voltage properties (see, for example, Patent Literature 2).

Meanwhile, there is a housing for an electronic device unit that encloses a substrate having an electronic component mounted thereon, where the housing includes two cases constituted by dividing a box body, respective opening parts of these two cases are butted and joined to form the box body, and the substrate is accommodated in the housing. Conventionally, in this housing, a space is generated in a portion where the two cases are butted, and accordingly there is a problem that an electrostatic discharge affects the electronic component from outside. As a countermeasure to this problem, a method of providing an insulating sheet inside of a housing so as to cover the butted portion and a method of not providing an electronic component on a substrate immediately below the butted portion are proposed.

CITATION LIST

Patent Literatures

Patent Literature 1: Japanese Utility Model Laid-open Publication No. S56-38498
Patent Literature 2: Japanese Utility Model Laid-open Publication No. H7-7227

SUMMARY

Technical Problem

However, in the housing for an electronic device unit described above that includes divided two cases, the method of providing an insulating sheet has problems such that assembling processes for attaching the insulating sheet are added, costs increase due to an increase in the number of components, the heights of electronic components are limited, and it becomes more inconvenient to separate the electronic components for recycling. Meanwhile, the method of not providing the electronic components on a substrate immediately below the butted portion also has a problem that there is a limitation on the arrangement of the electronic components and therefore mounting efficiency of the electronic components is degraded.

The present invention has been made in view of the above problems, and an object of the present invention is to provide a housing for an electronic device unit that can extend a creepage distance, which is likely to become a penetration path of an electrostatic discharge, from a portion where two cases are butted to an internal substrate so as to be a predetermined length, and can improve insulation properties against static electricity.

Solution to Problem

To solve the above described problems and achieve the objects a housing for an electronic device unit includes a first case and a second case that are formed in a shape of a box with one of respective surfaces thereof being opened and are formed to be a box body by butting and joining respective opening parts thereof to enclose a substrate having an electronic component mounted thereon. The housing includes an insulating plate that extends from the opening part of the first case to a side of the second case and overlaps with a wall surface of the second case. An engaging convex part is formed on a surface where the insulating plate is overlapped and an engaging hole that engages with the engaging convex part to regulate separation of the first case and the second case is formed on the wall surface of the second case at a position corresponding to the engaging convex part. The insulating plate is in a shape in which an edge of the insulating plate spreads with a predetermined width from an opening edge where the first case and the second case are butted and the engaging hole, so that a distance from the butted opening edge and the engaging hole to the edge is set to be a predetermined creepage distance.

Advantageous Effects of Invention

The housing for an electronic device unit according to the present invention includes an insulating plate that extends from substantially the entire edge of an opening of a first case in a butting direction and firmly attaches to an inner wall of a second case. The insulating plate is in a shape in which the edge of the insulating plate spreads with a predetermined width from a portion where the first case and the second case are butted and an engaging hole, so that a distance from the butted portion and the engaging hole to the edge is set to be a predetermined creepage distance. Accordingly, the creepage distance, which is likely become a penetration path of an electrostatic discharge, from the portion where the two cases are butted to an internal substrate can be set to a predetermined insulating distance and thus insulation properties against static electricity can be improved. With this configuration, it becomes unnecessary to provide an insulating sheet and also becomes unnecessary to set a region on a substrate immediately below the butted portion as a region on which arranging an electronic component is banned.

DESCRIPTION OF EMBODIMENTS

Exemplary embodiments of a housing for an electronic device unit according to the present invention will be explained below in detail with reference to the accompanying drawings. The present invention is not limited to the embodiments.

Embodiment

Figure 1:
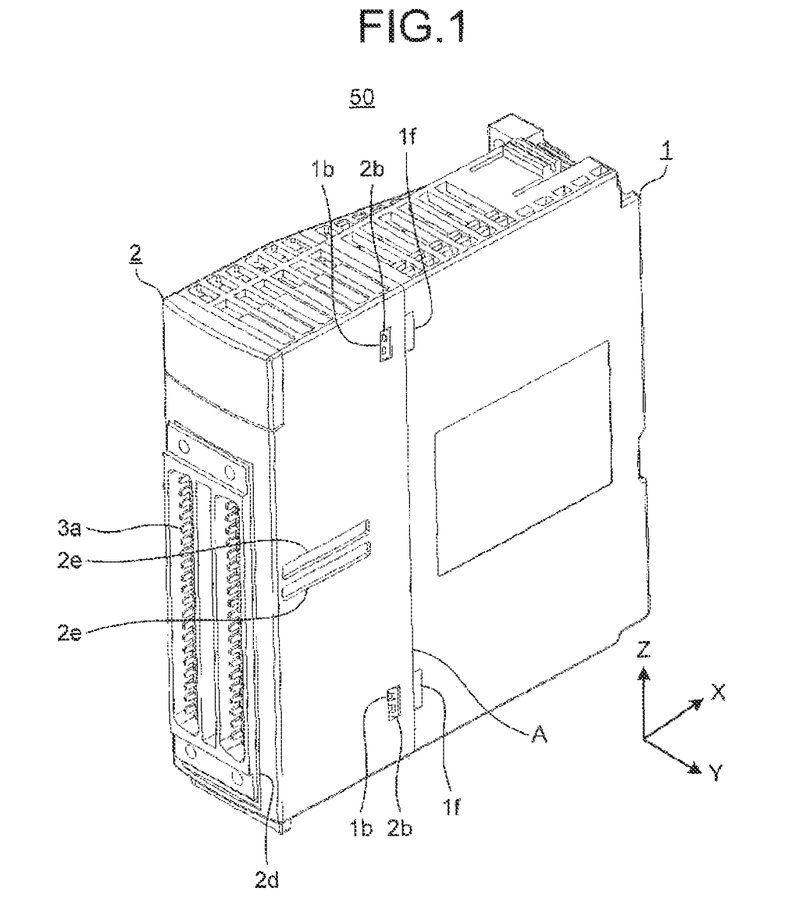
FIG. 1 is a perspective view of an overall appearance of a housing for an electronic device unit according to an embodiment of the present invention.
Figure 2:
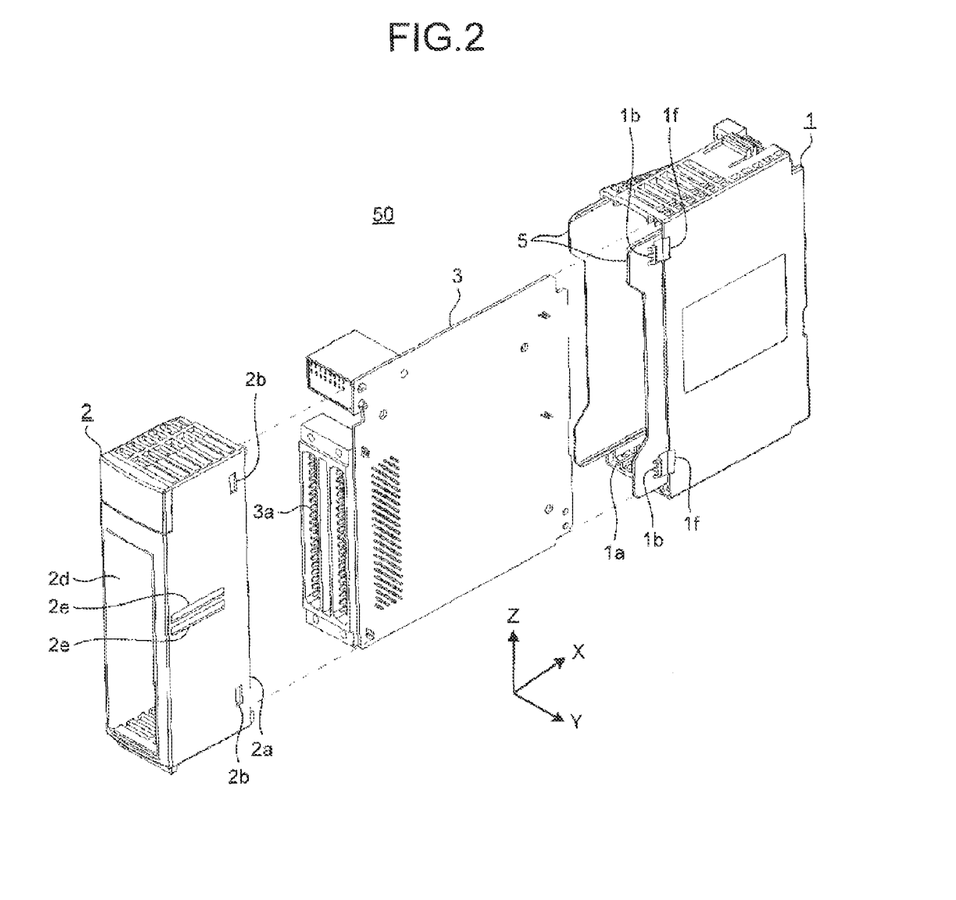
FIG. 2 is a perspective view of a state where a front case and a rear case are fit to accommodate a substrate.
Figure 3:
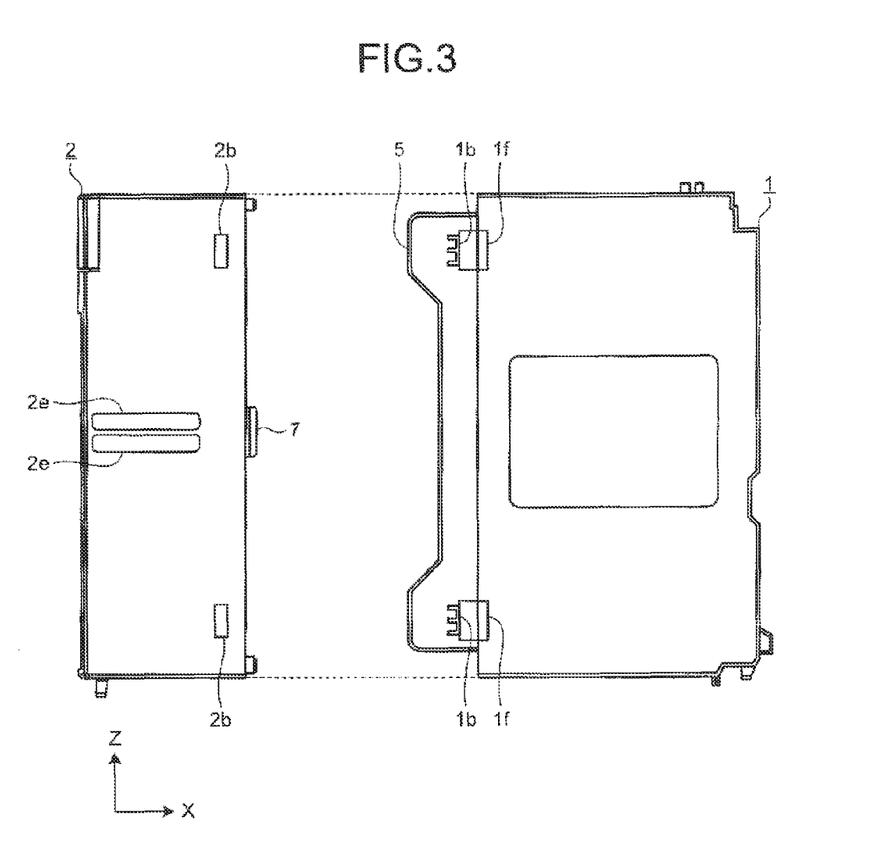
FIG. 3 is a side view of a state where a front case and a rear case are fitted.
Figure 4:
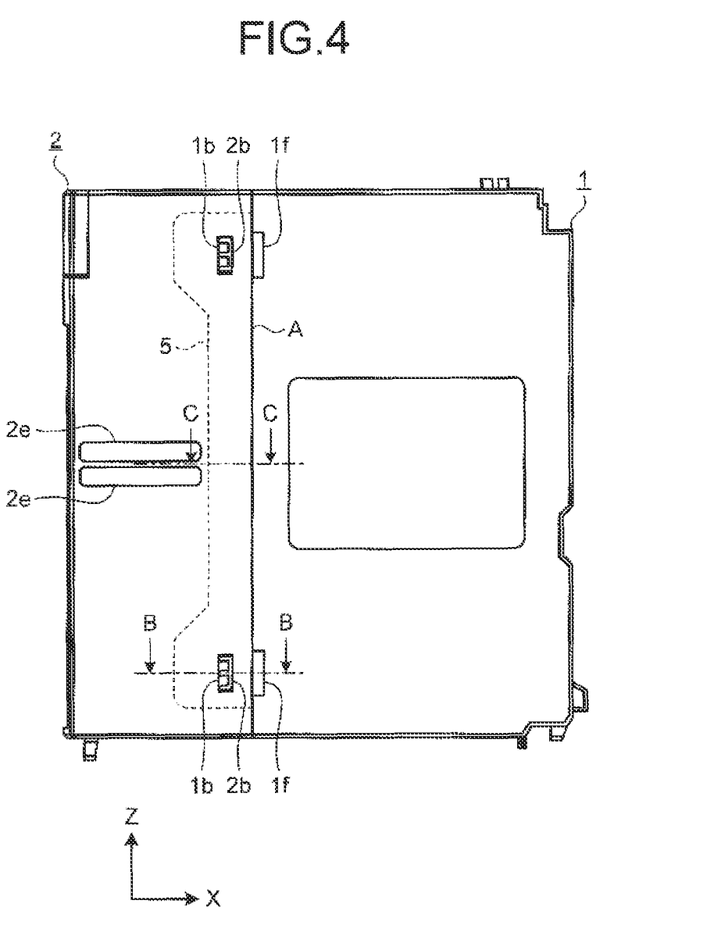
FIG. 4 is a side view of the housing for an electronic device unit.
Figure 5:
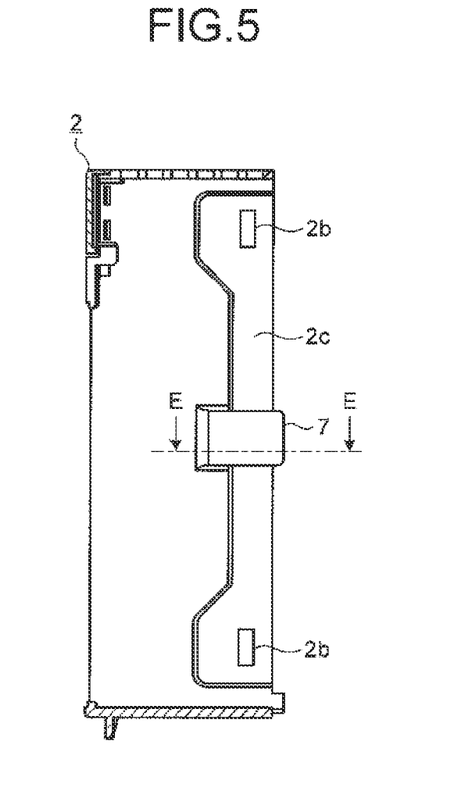
FIG. 5 is a longitudinal sectional view of a front case.
Figure 6:
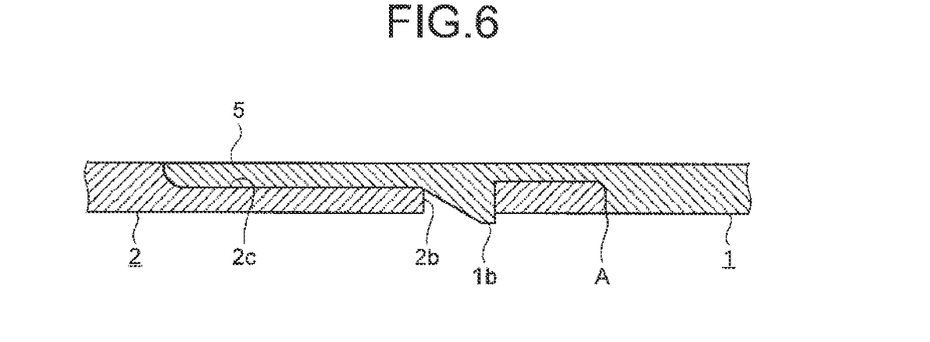
FIG. 6 is an arrow sectional view along a line B-B of FIG. 4.
Figure 7:
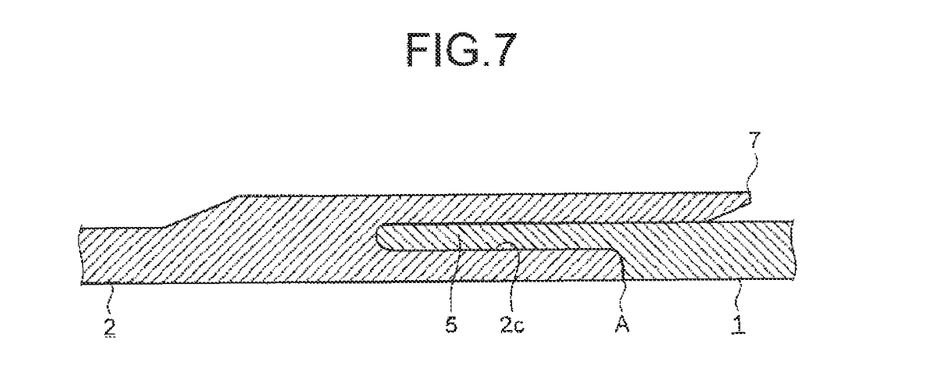
FIG. 7 is an arrow sectional view along a line C-C in FIG. 4.
Figure 8:
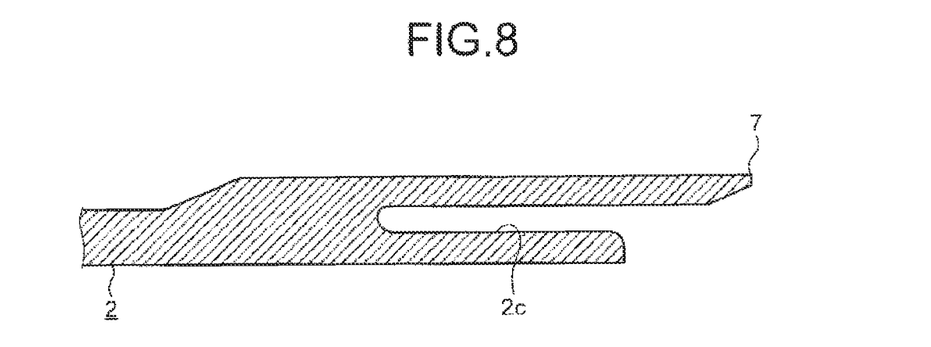
FIG. 8 is an arrow sectional view along a line E-E of FIG. 5.
Figure 9:
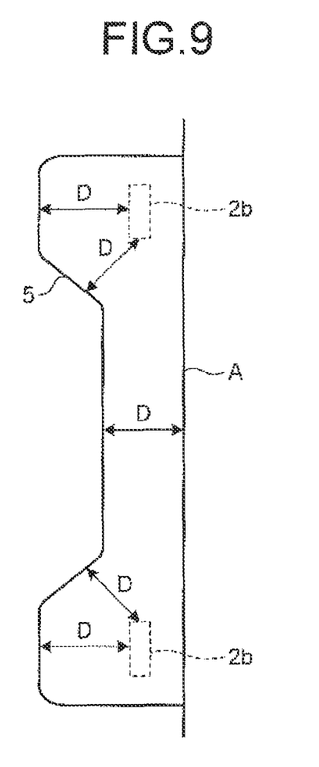
FIG. 9 is a pattern diagram for explaining a shape of an insulating plate.

FIG. 1 is a perspective view of an overall appearance of a housing for an electronic device unit according to an embodiment of the present invention. FIG. 2 is a perspective view of a state where a front case and a rear case are fit to accommodate a substrate. FIG. 3 is a side view of a state where a front case and a rear case are fitted. FIG. 4 is a side view of the housing for an electronic device unit. FIG. 5 is a longitudinal sectional view of a front case. FIG. 6 is an arrow sectional view along a line B-B of FIG. 4. FIG. 7 is an arrow sectional view along a line C-C in FIG. 4. FIG. 8 is an arrow sectional view along a line E-E of FIG. 5. FIG. 9 is a pattern diagram for explaining a shape of an insulating plate.

In the present embodiment, as shown in FIGS. 1 and 2, it is described that a height direction of a housing 50 for an electronic device unit (hereinafter, simply "housing") is designated as a Z-direction, a depth direction of the housing 50 is designated as an X-direction, and the width direction of the housing 50 is designated as a Y-direction; however, the present invention is not limited thereto. FIG. 3 only depicts a front case 2 and a rear case 1 and omits a substrate enclosed in the housing 50. FIGS. 6, 7, and 8 only depict shapes of sectional configurations.

The housing 50 accommodates therein a substantially plate-shaped substrate 3 having an electronic component (not shown) mounted thereon. In the present embodiment, as shown in FIG. 2, the substrate 3 is arranged to spread along an X-Z plane. The substrate 3 has an electronic component (not shown) mounted on a first surface (a component mounting surface) that is a main surface on one side of the substrate 3. Furthermore, the substrate 3 includes a connector 3a on an edge part on a minus X-direction side that is a front side of the housing (50).

Meanwhile, the housing 50 is in a shape of substantially flat hexahedron that extends along the substrate 3. That is, the housing 50 is substantially in a shape of cuboid that is elongated in the X-direction and the Z-direction and a thickness (a width) thereof is small (FIG. 1). The substrate 3 spreads over substantially the entirety in the housing 50 such that the main surface of the substrate 3 faces a large-area surface of inner surfaces of the housing 50. That is, the substrate 3 extends substantially in the entire area within the housing 50.

The housing 50 is divided into two on a plane perpendicular to the substrate 3 (a Z-Y plane) at a position near a central part of the housing 50. That is, the housing 50 is divided into the rear case (first case) 1 and the front case (second case) 2 (FIG. 2). The rear case 1 and the front case 2 are in a shape of a flat box with one of the respective surfaces being opened and include elongated opening parts 1a, 2a that spread in a shape of a rectangle. The opening parts 1a, 2a of respective cases are butted and fitted to form a box body, and the substrate 3 is enclosed in an internal space of the box body. When the rear case 1 and the front case 2 are fitted, the connector 3a becomes exposed from a rectangular hole 2d provided in an opposite side of the opening part 2a of the front case 2. Although the housing 50 for an electronic device unit according to the present embodiment is divided into the two cases of the rear case 1 and the front case 2, the housing 50 may be further divided into more than two cases.

Two insulating plates 5, 5 are provided inside of a butted opening edge A where the rear case 1 and the front case 2 are butted (a surface where the cases are coupled) (FIG. 2). The two insulating plates 5, 5 are provided to extend from substantially the entire edge of two long sides of the opening part 1a of the rear case 1 to a side of the front case 2 in a butting direction (the minus X-direction) and to spread along the X-Z plane so as to become parallel to the substrate 3. That is, the insulating plates 5, 5 are provided as a pair to extend from substantially the entire edge of the opening part 1a of the rear case 1, which faces the first surface (the component mounting part) of the substrate 3, and substantially the entire edge of the rear case 1, which faces a second surface on a reverse side of the first surface toward the side of the second case 2, respectively. When the rear case 1 and the front case 2 are connected, the cases are fitted by the insulating plates 5, 5 that are respectively attached firmly to an inner wall of the front case 2. The insulating plate 5 then covers over the butted opening edge A with respect to the internal space. That is, the rear case 1 and the front case 2 are fitted in an interlocking manner by the insulating plate 5 that protrudes from the opening part 1a of the rear case 1.

Engaging convex parts 1b, 1b are formed on respective outside main surfaces (surfaces that contact the inner wall of the front case 2) of the two insulating plates 5, 5, (FIG. 2). Meanwhile, engaging holes 2b, 2b are formed on the inner wall of the front case 2 at positions corresponding to the engaging convex parts 1b, 1b so as to pierce to an outside surface. The engaging convex parts 1b, 1b and the engaging holes 2b, 2b are engaged with each other, thereby regulating separation of the rear case 1 and the front case 2 fitted to each other. Sides of the engaging convex parts 1b, 1b in a butting direction are formed to be inclined to enable the engaging convex parts 1b, 1b to favorably engage with the engaging holes 2b, 2b when the rear case 1 is slid in the butting direction (the minus X-direction) toward the front case 2 when these cases are fitted to each other (FIG. 6).

Jig-inserting inclination parts 1f into which a dedicated jig is inserted are provided on an outside surface of the rear case 1 at positions near the engaging convex parts 1b, 1b adjacent to the butted opening edge A. The jig-inserting inclination part 1f is a concave part of which a bottom into which a dedicated jig for releasing the fitting between the rear case 1 and the front case 2 is inserted is inclined. When separating the rear case 1 and the front case 2, a wall surface of the rear case 1 is pressed toward the inside by the dedicated jig to release the engaging convex parts 1b, 1b from the engaging holes 2b, 2b.

As depicted in FIG. 9, the insulating plate 5 spreads with a predetermined width D from the opening edge A where the rear case 1 and the front case 2 are butted and the engaging holes 2b, 2b, so that the distance from the butted opening edge A and the engaging holes 2b, 2b to an edge of the insulating plate 5 is set to be a predetermined creepage distance. That is, the insulating plate 5 spreads to be in a shape that is formed by following the creepage distance from the butted opening edge A and the engaging holes 2b, 2b. Specifically, the insulating plate 5 spreads in a middle part thereof such that a distance from the butted opening edge A to the edge of the insulating plate 5 is set to be the predetermined width D. Furthermore, because the engaging convex parts 1b, 1b are formed on both Z-direction ends of the insulating plate 5 and the engaging holes 2b, 2b are opened on the wall surface of the front case 2 that faces the engaging convex parts 1b, 1b, the insulating plate 5 is in a shape in which the edge of the insulating plate 5 spreads with the predetermined width D also from the engaging holes 2b, 2b. That is, as compared to the middle part, the both Z-direction ends of the insulating plate 5 protrude in the butting direction (the minus X-direction) more largely, so that the distance from the engaging holes 2b, 2b to the edge of the insulating plate 5 is set to be a predetermined creepage distance. If an engaging convex part is also provided in the middle part of the insulating plate 5 and an engaging hole is opened in the wall surface of the front case 2 that faces this engaging convex part, the middle part of the insulating plate 5 protrudes largely in the butting direction similarly to the both ends.

In the present embodiment, while the insulating plates 5, 5 enter the opening part 2a of the front case 2 and overlap with the inner wall of the front case 2, the insulating plates 5, 5 may be provided in such a manner to cover the opening part 2a of the front case 2 so as to overlap with an outside wall of the front case 2. In this case, the engaging convex parts 1b, 1b are respectively formed on a main surface of the inside of the insulating plates 5, 5 (a surface that contacts the outside wall of the front case 2). Also in this case, the insulating plates spread with a predetermined width from a butted opening edge and engaging holes, so that the distance from the butted opening edge and the engaging holes to an edge of the insulating plate is set to be a creepage distance. With this configuration, substantially identical effects to that of the case that overlaps with the inner wall can be achieved.

A fitting concave part 2c as a recess with a shape identical to that of the insulating plate 5 is formed on the inner wall of the front case 2 (FIG. 5). The fitting concave part 2c has the same thickness and depth as those of the insulating plate 5, and overlaps with the insulating plate 5 to accommodate the insulating plate 5 therein in an embedding manner so as to eliminate difference in level on the inner surfaces of the housing 50 (FIG. 6). The inner wall of the front case 2 where the fitting concave part 2c is formed and the insulating plate 5 are configured to have a minimum thickness necessary for a housing for an electronic device unit and to secure a basic plate thickness when overlapping with each other. The basic plate thickness is a thickness same as a conventional wall plate thickness, and by having the basic plate thickness unchanged, it is possible to secure a basic external shape and an internal spatial volume in conventional specifications and it is possible not to increase limitations on an area of a substrate capable of mounting components. Furthermore, because the cases are thin-walled, corners of an end of the insulating plate 5 in the butting direction are rounded in a shape of a circular arc as viewed from a sectional view, so that the insulating plate 5 may be easily molded.

As depicted in FIGS. 5, 7, and 8, a guiding rib 7 is provided at a middle part of a long side of the opening part 2a of the front case 2 so as to face the fitting concave part 2c with a predetermined interval therebetween. The guiding rib 7 extends from the inner wall of the front case 2 toward the opening part 2a of the front case 2, and an end of the guiding rib 7 protrudes from the opening part 2a. When the rear case 1 and the front case 2 are fitted in an interlocking manner, the guiding rib 7 guides the insulating plate 5 and sandwiches the insulating plate 5 in cooperation with the fitting concave part 2c to suppress displacement of the insulating plate 5 toward inside.

The edge of the guiding rib 7 is provided with a chamfering or a round chamfering so that the insulating plate 5 may be easily inserted thereinto. Because sink marks are likely to be formed at a time of resin-molding, a concave part 2e is provided on a corresponding outside surface of the front case 2 (FIG. 3).

As described above, in the housing 50 for an electronic device unit according to the present embodiment, because the insulating plate 5 spreads with a predetermined width from the opening edge A where the rear case 1 and the front case 2 are butted and the engaging hole 2b, so that the distance from the butted opening edge A and the engaging hole 2b to the edge of the insulating plate 5 is set to be a predetermined creepage distance, the creepage distance from an external space to an internal space is set to be a predetermined distance, thereby securing required insulation against static electricity and eliminating the necessity of providing an insulating sheet as in conventional techniques. Even without setting a region on a substrate immediately below a space in the butted opening edge A (the surface where cases are coupled) as a region on which arranging electronic components are banned, because a creepage distance, which is likely to become a penetration path of an electrostatic discharge, from the space in the butted opening edge A to an internal substrate is increased, insulation properties against static electricity can be improved.

In a conventional housing including an insulating sheet, the thickness of the insulating sheet causes problems that it is necessary to limit the height of components mounted on a substrate immediately below a space in the butted edge A and the assemblability of the housing is poor. However, by eliminating the necessity of an insulating sheet, it is possible to eliminate limitations on the height of components mounted on a substrate and to improve the assemblability of the housing. In addition, with the configuration of not using an insulating sheet, it is possible to reduce costs for an electronic device unit and the electronic device unit can be easily separated for recycling.

Furthermore, even when the substrate 3 is arranged such that the main surface of the substrate 3 faces the opening edge A where the rear case 1 and the front case 2 are butted and a space is formed in the butted opening edge A, because the insulating plate 5 covers over the space so that the space is not exposed, it is possible to suppress an electrostatic discharge.

Further, because the guiding rib 7 is provided on the inner wall of the front case 2, when fitting the rear case 1 and the front case 2, the guiding rib 7 appropriately guides the insulating plate 5, and thus it becomes easier to assemble the cases. Moreover, the guiding rib 7 has a reinforcing effect to prevent the insulating plate 5 and the wall surface of the rear case 1 from being bent toward inside. Therefore, the strength of the entire housing for an electronic device unit can be improved.

In addition, because the jig-inserting inclination parts 1*f* into which a dedicated jig is inserted are provided on the outside surface of the rear case 1 at positions near the engaging convex parts 1*b*, 1*b* adjacent to the butted opening edge A, the electronic device unit cannot be easily disjointed.

INDUSTRIAL APPLICABILITY

As described above, the housing for an electronic device unit according to the present invention is preferably used for a housing for an electronic device unit that includes divided two cases and encloses a substrate having an electronic device mounted thereon.

REFERENCE SIGNS LIST

1 rear case (first case)
1*a* opening part
1*b* engaging convex part
1*f* jig-inserting inclination part
2 front case (second case)
2*a* opening part
2*b* engaging hole
2*d* rectangular hole
2*c* fitting concave part
2*e* concave part
3 substrate
3*a* connector
5 insulating plate
7 guiding rib
50 housing for electronic device unit

The invention claimed is:

1. A housing for an electronic device unit including a first case and a second case that are formed in a shape of a box with one of respective surfaces thereof being opened and are formed to be a box body by butting and joining respective opening parts thereof to enclose a substrate having an electronic component mounted thereon, the housing comprising:
an insulating plate that extends from the opening part of the first case to a side of the second case and overlaps with a wall surface of the second case, wherein
an engaging convex part is formed on a surface where the insulating plate is overlapped and an engaging hole that engages with the engaging convex part to regulate separation of the first case and the second case is formed on the wall surface of the second case at a position corresponding to the engaging convex part; and
the insulating plate is in a shape in which an edge of the insulating plate spreads with a predetermined width from an opening edge where the first case and the second case are butted and the engaging hole, so that a distance from the butted opening edge and the engaging hole to the edge is set to be a predetermined creepage distance;
wherein a fitting concave part that embeds the insulating plate therein is provided on an inner wall of the second case.

2. The housing for an electronic device unit according to claim 1, wherein
the substrate has an electronic component mounted on a first surface, and
the insulating plates are provided to extend from substantially an entire edge of the opening part of the first case, which faces the first surface of the substrate, and substantially an entire edge of the first case, which faces a second surface on a reverse side of the first surface to the side of the second case, respectively.

3. The housing for an electronic device unit according to claim 1, wherein the insulating plate enters the opening part of the second case and overlaps with an inner wall of the second case.

4. The housing for an electronic device unit according to claim 1, wherein a guiding rib that extends from the inner wall of the second case in a direction of the opening part of the second case so as to face the fitting concave part and sandwiches the insulating plate with the fitting concave part is provided.

5. The housing for an electronic device unit according to claim 1, wherein a guiding rib that extends from the wall surface of the second case in a direction of the opening part of the second case and sandwiches the insulating plate with the wall surface where the insulating plate is overlapped is provided.

6. The housing for an electronic device unit according to claim 5, wherein the guiding rib protrudes from the opening part of the second case.

* * * * *